United States Patent [19]

Kosanda

[11] Patent Number: 4,762,966
[45] Date of Patent: Aug. 9, 1988

[54] ELECTROMAGNETIC SIGNAL INTERFERENCE SHIELDING GASKET APPARATUS

[75] Inventor: David E. Kosanda, Richardson, Tex.

[73] Assignee: Rockwell International Corporation, El Segundo, Calif.

[21] Appl. No.: 67,512

[22] Filed: Jun. 26, 1987

[51] Int. Cl.⁴ ............................................. H05K 9/00
[52] U.S. Cl. .................................. 174/35 GC; 49/490
[58] Field of Search ........... 174/35 GC; 219/10.55 D; 24/295, 265 A; 49/483, 490

[56] References Cited

U.S. PATENT DOCUMENTS

| | | | |
|---|---|---|---|
| 2,133,789 | 10/1938 | Pool | 174/35 GC |
| 2,844,644 | 7/1958 | Soule, Jr. | 174/35 GC |
| 3,904,810 | 9/1975 | Kraus | 174/35 GC X |
| 4,554,400 | 11/1985 | Schmalzl | 174/35 GC |
| 4,640,979 | 2/1987 | Schmalzl | 174/35 GC |

Primary Examiner—A. T. Grimley
Assistant Examiner—David A. Tone
Attorney, Agent, or Firm—Bruce C. Lutz; V. L. Sewell; H. Fredrick Hamann

[57] ABSTRACT

The present invention uses a plurality of spaced contact fingers to provide EMI (electromagnetic interference) shielding at the gap junction between the edge of a sheet metal panel and its butt interface with a narrow flat surface. Each of the fingers comprises a U-shaped portion enclosing the sheet metal panel edge and a V-shaped portion situated substantially at right angles to the U-shaped portion and urging the U-shaped portion in an outwardly direction so as to provide contact between the sheet metal panel and the flat surface to which it is interfacing.

7 Claims, 3 Drawing Sheets

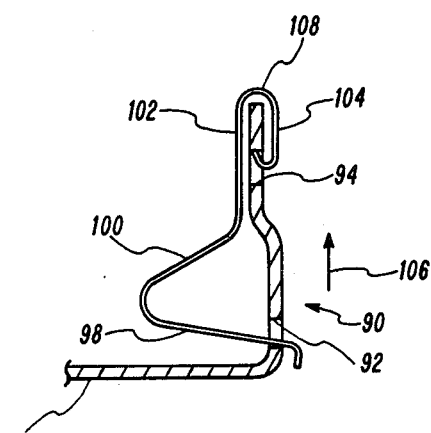
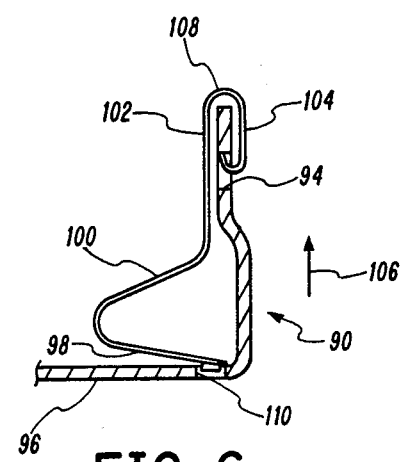
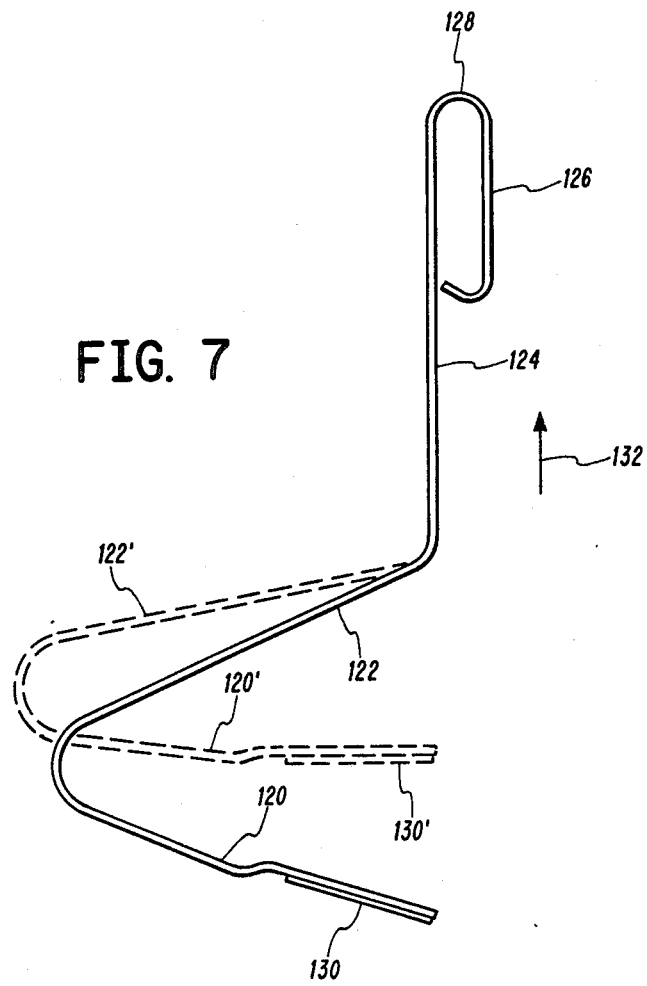

ELECTROMAGNETIC SIGNAL INTERFERENCE SHIELDING GASKET APPARATUS

THE INVENTION

The present invention is directed generally to electromagnetic interference (EMI) gaskets and, more specifically, to electronic gaskets for preventing the passage of electromagnetic signals of higher than a given frequency. Even more specifically, the present invention is directed to an EMI gasket, which operates satisfactorily in an interface between an edge of a sheet metal panel and a reasonably flat surface, against which the sheet metal panel abuts.

BACKGROUND

Although various companies have made forms of EMI shielding gaskets secured with double-sided tape or having clips that are used for parallel (2 flat) surface applications, the applicant does not know of any instance where such EMI gasketing material operates between the edge of a sheet metal panel and a flat surface area which is no more (in the width direction) than double the dimension of the sheet metal panel thickness.

It is, therefore, an object of the present invention to provide an improved EMI gasket for use between a sheet metal panel edge and a limited space flat surface.

Other objects and advantages of the present invention will be apparent from a reading of the specification and appended claims in conjunction with the drawings, wherein:

FIG. 5 illustrates a second embodiment of the gasket fingers utilizing the sheet metal panel as a force base rather than a turned over edge of the panel as previously shown in FIG. 2;

FIG. 6 shows a variation of the finger as compared to FIG. 2 using the same portion of the panel as a force base; and FIG. 7 illustrates a fourth embodiment of the inventive concept utilizing double-sided tape to secure and position the fingers relative the gasketed sheet metal panel edge.

DETAILED DESCRIPTION

Figure 1:
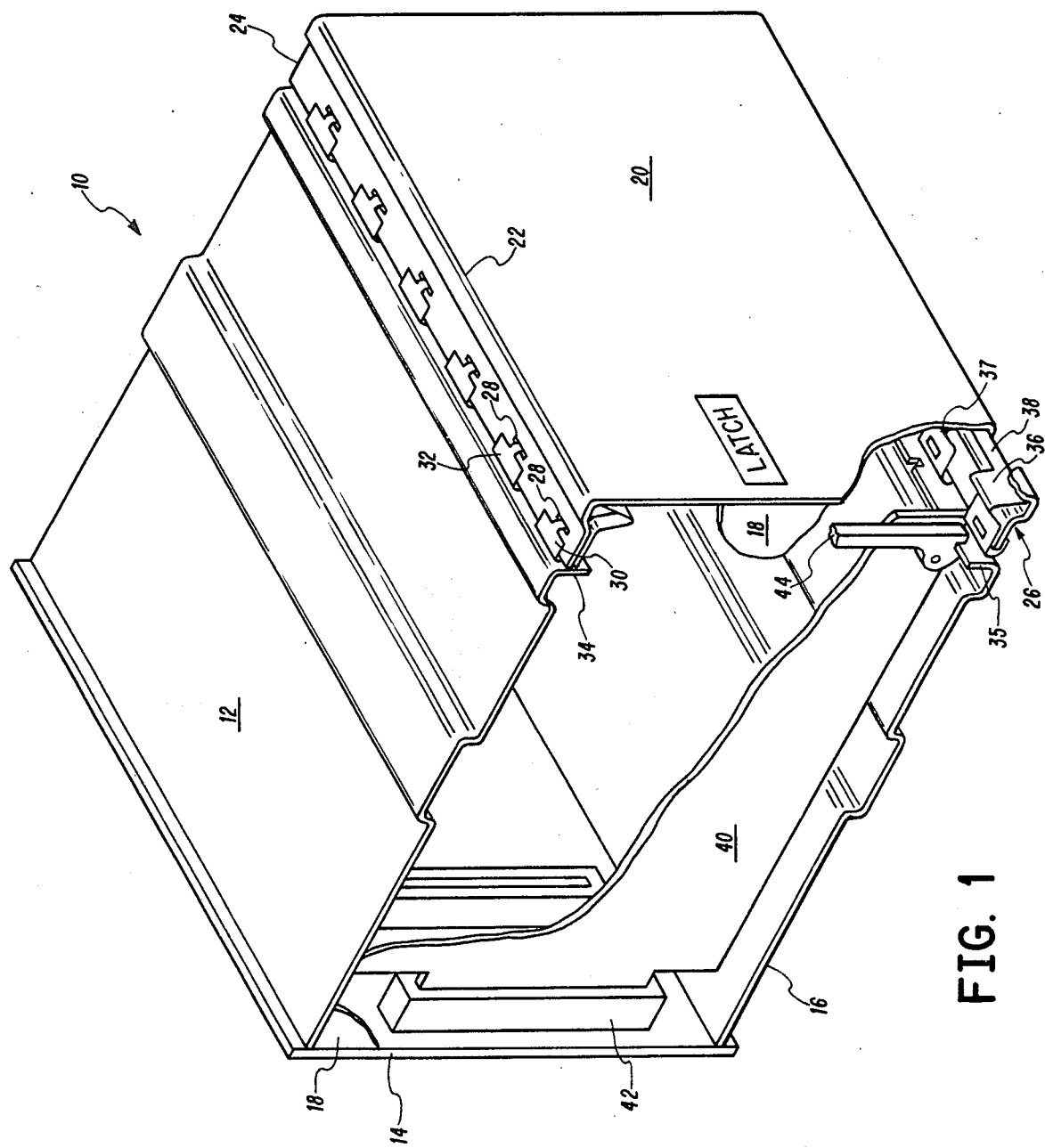
FIG. 1 is a cutaway drawing of a printed circuit card holding box using the present invention between a door or cover to the box and the box itself.

In FIG. 1, a panel rack or box, generally designated as 10, is shown with a top card guide portion 12, a backplane 14, a lower card guide portion 16 and a side panel 18. In addition, there is a sheet metal panel door or access cover, generally designated as 20, having a corner area 22 and a sheet metal panel lip edge 24. Cover 20 has a similar sheet metal panel lip on the lower portion of the drawing and designated as 26. Situated on the sheet metal panel lip edge 24 are a plurality of openings, designated as 28, and a plurality of gasket fingers, two of which are designated as 30 and 32. A flat edge of top portion 12 is designated as 34, and a similar portion of bottom 16 is designated as 35. Portions 34 and 35 constitute the reasonably flat surface against which the butt edge of sheet metal portions 24 and 26 must respectively abut. As will be realized, the "flat" is merely close to being flat since typically sheet metal is "formed" by bending flat sheets of material and the bending causes internal stresses. The fingers, such 30 and 32, provide the gasket interface between areas 24 and 34, while fingers such as 36 and 37, provide a similar gasketing function between panel portions 26 and 35. As illustrated in the lower portion of FIG. 1, a connecting bridge is designated as 38. This connecting bridge may be used for easing the installation of the fingers as a set, and for maintaining proper spacing of the fingers in some embodiments of the inventive application. Within the box 10, there is room for a plurality of cards, one cutaway card is designated as 40 and is connected into a electrical plug receptacle 42. A handle 44 is shown which is used as a means to facilitate both the installation and removal of the card by providing forces to the card as to make electrical contact with the contacts within receptacle 40, or to ease the removal of the card from the friction pressure of these contacts. A handle, similar to that of 44, may be used on the upper portion of the box and the card 40 (if necessary), to equalize the pressures applied to the card 40.

Figure 2:
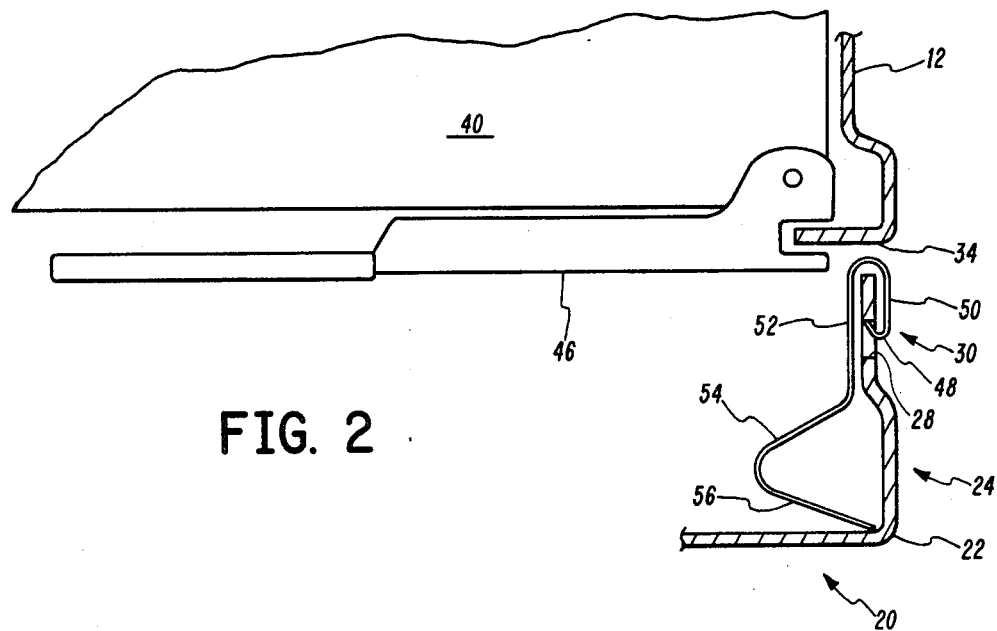
FIG. 2 is a detailed drawing illustrating a side view representative of the conditions shown in FIG. 1.

In FIG. 2, numbers as appropriate to those shown in FIG. 1 are used where possible. In addition, a second handle 46 is illustrated to insert the card 40. The finger 30 is shown as having a tab 48 inserted into opening 28 and the finger 30 has a first surface 50 and a second surface 52 forming a U-shaped enclosure of the edge of panel 24. A third surface 54 and a fourth surface 56 form a generally V-shaped section of the finger situated substantially at right angles to the U-shaped portion previously defined. The V-shaped portion comprising surfaces 54 and 56 provide a pressure away from the base of cover 20 and in a direction parallel to the surface of panel lip 24 toward the flat surface 34 of panel 12.

Figure 3:
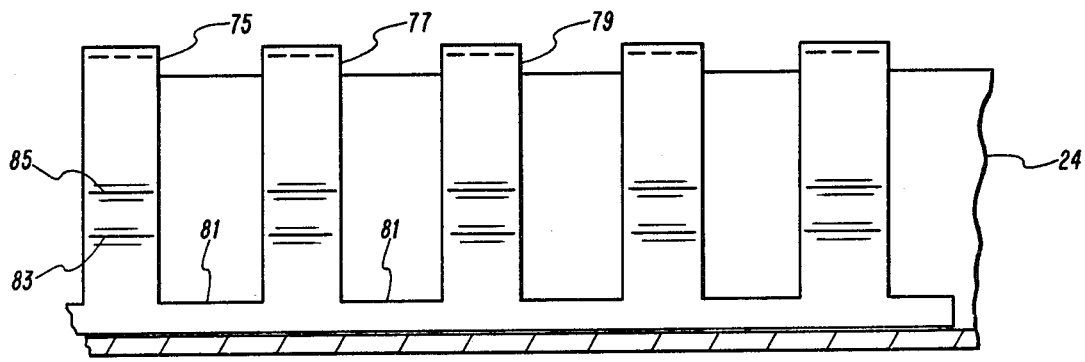
FIG. 3 is a front or inside view of a plurality of gasket fingers of the type illustrated in FIG. 2.

In FIG. 3, the panel lip 24 is shown with a plurality of fingers such as 75, 77, and 79, each interconnected with a web of material designated as 81. The material 81 would correspond to that shown and designated as 38 in FIG. 1. On finger 75, a bend area designated as 83 is shown which corresponds to the bend between portions 54 and 56 of the finger of FIG. 2. The bend area 85 corresponds to the bend between surfaces 52 and 54 of FIG. 2 and define the junction between the V and the U-shaped portions of the finger means.

Figure 4:
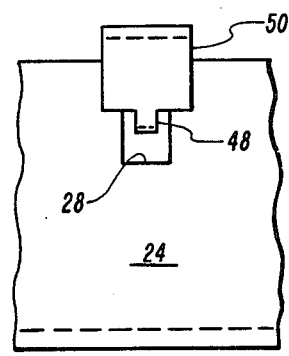
FIG. 4 shows in slightly more detail the portion of the finger extending over the sheet metal edge and its positioning and movement limiting tab.

In FIG. 4, an outside view of the surface of panel 24 of FIG. 2 is illustrated in more detail with the surface 50 being bent over the outside of panel lip 24 and the tab 48 being inserted into opening 28 for restricting the amount of vertical and horizontal movement of the spring due to forces generated by the V-shaped portion comprising surfaces 54 and 56.

In FIG. 5, a sheet metal section 90 has an opening 92 and an opening 94 with a right angle section 96. A contact finger embodying the concepts of the present invention has a first surface 98, and a second surface 100 wherein these two surfaces define a V-shaped section. Third and fourth surfaces 102 and 104 are designated which form a U-shaped portion and enclose an edge of panel 90, as well as being connected to one end of V-shaped portion comprising surfaces 98 and 100. An extension of surface 98 hooks through opening 92 to establish a base for a force in the direction of an arrow 106, which is substantially parallel to the panel surface of panel 90. This is the direction that the U-shaped portion having a contact surface 108 is urged. Surface 108 would be making contact against a surface, such as the flat surface 34 of FIG. 1.

FIG. 6 is similar to FIG. 5, except that the surface 98 has a tab situated slightly differently so that it coacts with a recess or an opening 110 in the portion 96 of the panel, rather than in the side portion 90 as shown in FIG. 5. This still provides a base for exerting a force in the direction 106 as previously indicated, so that the surface 108 can make contact with a flat abutting surface.

FIG. 7 shows a version of the finger where the finger comprises portions 120 and 122, constituting the V-shaped force providing portion of the finger, while portions 124 and 126 provide the U-shaped portion, a surface 128 provides the contact area, and a piece of double-sided tape 130 provides attachment to the base for supplying a force in the direction of arrow 132. As drawn, this is the relaxed position where no force is provided. A dash line area with legs, designated as 120' and 122', shows the clip in a mounted position, where the force, shown as 132, is exerted to maintain a contact pressure between surface 128 and a surface, such as 34 in FIG. 1.

As will be realized, the material used in constructing the fingers must be a resilient material which can be deformed, whereby it will assume a given normal form, but it can also be temporarily deformed to maintain a good electrical contact when compressed by low stress deforming forces, such as when the cover 20 is attached to the remaining portion of box 10 of FIG. 1. One such material is beryllium copper. Another material that would perform satisfactorily is phosphor bronze.

For the purpose of defining the shape of the spring-like member in the claims, relative angles have been used. As an example of terminology only and not to be considered as restrictive, the spring of FIG. 6 may be considered to have first, second, third and fourth surfaces 98, 100, 102 and 104, respectively. Although the portions 98 and 100 form an acute angle therebetween, the single piece of metal that is used to form this resultant product would typically be placed in a bending device and the formerly straight or flat piece of metal is bent to an angle of between 110 and 170 degrees to form this acute angle. The piece of metal is then bent in the opposite direction and thus may be said to be bent in a negative angle of between −20 and −70 degrees to form the obtuse angle between portions 100 and 102. Finally, to form the portion which encloses the lip of the sheet metal 90, the portion 104 is bent, relative to the previously straight portion 180 degrees with respect to the surface 102. As may be appreciated by those skilled in the art, a negative angle as defined with respect to bending a sheet of flat metal can be positive bends in one direction of bending and reverse angle or negative bends in the opposite direction.

OPERATION

Although the operation of the present invention should be self-evident from the previous information, it may be summarized as a resilient clip which in a preferred embodiment contains spacing material, such as shown in FIG. 1 as interconnecting material 38, and FIG. 3 as interconnecting material 81 which is used both for spacing of the fingers and for ease of installation. The clips contain a force providing V-shaped portion connected to a sheet metal lip edge engaging U-shaped portion with locating tabs, such as 48 of FIG. 2, on the U-shaped portion. This locating tab interacts with an opening, such as 28 of FIG. 1 or FIG. 2, to keep the force from the V-shaped portion from extending the U-shaped portion out beyond a given amount above the edge of the sheet metal panel, such as 24 of either FIG. 1 or FIG. 2. When the panel, such as 20 of FIG. 1, is attached to the main box 10 of FIG. 1, the U-shaped portions are forced back towards the edge of panel lips 24 and 26, during which time electrical contact is maintained between the cover 20 and the box 10. The spacing between the various fingers, such as 32 and 34, is such that signal frequencies of lower than a given frequency cannot pass through the opening. Although the contact fingers should operate and maintain their position as described thus far and as illustrated in FIG. 2, various additional embodiments are illustrated in FIGS. 5 through 7 with provisions for attaching the V-shaped portion at a base support extremity to prevent excessive movement of the finger with respect to the panel edge, shown as 90 in FIGS. 5 and 6.

While I have shown a preferred embodiment of the inventive concept and several alternative embodiments, I wish to be limited not by the scope of the invention as illustrated, but only by the appended claims wherein I claim:

1. An article of manufacture for providing EMI shielding between a sheet metal panel edge and its butt interface with an adjacent flat surface wherein the sheet metal panel included two separate openings for cooperation with tabs on said article of manufacture comprising, in combination:

a plurality of interconnected electrically conductive and mechanically resilient contact fingers each being shaped identically and comprising first, second, third and fourth flat portions situated at various angles with respect to each other;

said first flat portion including means for interaction with said sheet metal panel edge to minimize movement of said first flat portion in a first direction perpendicular to the surface of the sheet metal panel;

said second flat portion bent to an angle of between 110 and 170 degrees with respect to said first flat portion, said first and second flat portions cooperating to provide an outward force to the remaining third and fourth flat portions which outward force is in a second direction substantially parallel to the surface of said sheet metal panel;

said third flat portion bent to an angle of between −20 and −70 degrees with respect to said second flat portion, said third flat portion operating in a sliding relationship parallel to the sheet metal panel; and said fourth flat portion bent to an angle of substantially 180 degrees with respect to said third flat portion and including a tab for co-acting in an outwardly sliding relationship with the sheet metal panel and preventing more than a given amount of outward movement.

2. Electomagnetic radiation interference (EMI) reduction apparatus for use in conjunction with a sheet metal edge which abuts a flat surface comprising, in combination:

a plurality of contact fingers electrically and mechanically interconnected at the base thereof, each of said contact fingers being substantially identical, formed from mechanically resilient material and comprising first, second, third and fourth substantially flat surface portions;

said first and second portions comprising a part of the base and forming a V-shaped first angle for supplying a force, in a direction away from said base, parallel to the side of the sheet metal; and said third and fourth portions forming a U-shaped second angle for slideably enclosing a section of the sheet metal edge, the portions forming the second angle being connected to the portions forming said first angle and resiliently moving in an outwardly direction, parallel to the surface of the sheet metal, in response to forces from the portions forming said first angle.

3. Electromagnetic gasket apparatus for use as an interface between a sheet metal edge and a flat surface comprising, in combination:

a plurality of resilient conductive metal U-shaped finger means, including tab means, for slideably engaging both sides of the sheet metal adjacent said sheet metal edge with said tab means co-acting with an opening in the sheet metal for preventing the extension of said finger means beyond a given distance from said sheet metal edge;

V-shaped spring means, forming an extension of said finger means at substantially right angles to said finger means and including further tab means interacting with a further opening in said sheet metal means, for providing resilient forces to said finger means parallel to the surface of the sheet metal to encourage the extension of said finger means away from said sheet metal edge; and spacing means, interconnecting each of said V-shaped spring means, to maintain said finger means to no greater than a given distance apart to prevent the passage of signals of less than a given frequency through said gasket apparatus.

4. Electromagnetic radio signal interference gasket apparatus as a butt interface between the edge of a piece of sheet metal, having at least two different openings for cooperating with the gasket apparatus, and a flat surface comprising, in combination:

a plurality of U-shaped resilient metal means, including tab means for interaction with one of said at least two different openings, on one leg of the U-shaped means, for restraining the outward movement of said metal means when enclosing the edge of the sheet metal; and a plurality of V-shaped resilient metal means, each comprising an extension of the other leg of a corresponding U-shaped metal means and substantially at right angles to said U-shaped metal means, including tab means for interaction with the other of said at least two different openings, on the leg of the V-shaped means not attached to said U-shaped means, for urging the outward movement of said U-shaped metal means towards the flat surface when the U-shaped metal means is enclosing the edge of the sheet metal.

5. An article of manufacture comprising a gasket for providing reduction of electromagnetic radiation interference (EMI) between a sheet metal panel edge and an abutting flat interfacing surface wherein the sheet metal panel includes openings for the attachment of the said gasket, comprising, in combination:

a plurality of contact fingers electrically and mechanically interconnected at the base thereof, each of said contact fingers being shaped substantially identical, formed from mechanical resilient material and comprising first, second, third, fourth, and fifth substantially flat portions situated at various angles with respect to each other;

said first flat portion including a connecting link to the remaining ones of said plurality of contact fingers forming a base for exerting a spring action force in a first direction parallel to the sheet metal panel and further including a tab for interacting with the said panel to maintain a given location and electrical contact;

said second flat portion bent to an angle of between 110 and 170 degrees with respect to the first portion and, in cooperation with said first portion, forming a V-shaped section which provides an outward force to said third and fourth portions in a said first direction;

said third flat portion bent in a reverse angle direction of 20 to 70 degrees to said second flat portion so as to be essentially parallel and in close sliding contact to the sheet metal panel;

said fourth flat portion bent in an angle of substantially 180 degrees with respect to the third portion to form a U-shaped section which encloses the sheet metal panel edge in a sliding relationship; and said fifth flat portion comprising a tab bent at an angle of approximately 110 degrees with respect to the fourth flat portion to interact with one of said openings in the sheet metal panel to retain the fingers in an outwardly sliding relationship with the sheet metal panel and providing a predetermined maximum amount of outward movement.

6. Electromagnetic gasket apparatus for use as an interface between a sheet metal edge and a flat surface comprising, in combination:

a plurality of resilient conductive metal U-shaped finger means, including tab means, for slideably engaging both sides of the sheet metal adjacent said sheet metal edge with said tab means co-acting with spaced openings in the sheet metal for preventing the extension of said finger means beyond a given distance from said sheet metal edge; and V-shaped spring means, forming an extension of said finger means at substantially right angles to said finger means and including further means for interacting with said sheet metal means whereby resilient forces are provided to said finger means parallel to the surface of the sheet metal to encourage the extension of said finger means away from said sheet metal edge; and the spacing of said spaced openings acting to maintain said finger means to no greater than a given distance apart to prevent the passage of signals of less than a given frequency through said gasket apparatus.

7. Electromagnetic gasket apparatus for use as an interface between a sheet metal edge of a given thickness and a flat surface comprising, in coabination:

a plurality of resilient conductive metal U-shaped finger means, where the legs of the U-shaped finger are only slightly farther apart than the thickness of the sheet metal edge, including tab means, for slideably engaging both sides of the sheet metal adjacent said sheet metal edge with said tab means co-acting with an opening in the sheet metal for preventing the extension of said finger means beyond a given distance from said sheet metal edge and providing self-securing of the finger means of the gasket apparatus;

V-shaped spring means, forming an extension of said finger means at substantially right angles to said finger means and including further tab means interacting with a further opening in said sheet metal means, for providing resilient forces to said finger means parallel to the surface of the sheet metal to encourage the extension of said finger means away from said sheet metal edge; and spacing means, interconnecting each of said V-shaped spring means, to maintain said finger means to no greater than a given distance apart to prevent the passage of signals of less than a given frequency through said gasket apparatus.

* * * * *